United States Patent
Wheaton

(10) Patent No.: US 10,578,701 B2
(45) Date of Patent: Mar. 3, 2020

(54) SYSTEMS, METHODS, AND COMPUTER-READABLE STORAGE MEDIUM FOR MAGNETIC RESONANCE IMAGING

(71) Applicant: Toshiba Medical Systems Corporation, Otawara-shi (JP)

(72) Inventor: Andrew James Wheaton, Shaker Heights, OH (US)

(73) Assignee: Canon Medical Systems Corporation, Otawara-shi (JP)

(*) Notice: Subject to any disclaimer, the term of this patent is extended or adjusted under 35 U.S.C. 154(b) by 308 days.

(21) Appl. No.: 15/791,898

(22) Filed: Oct. 24, 2017

(65) Prior Publication Data

US 2019/0120922 A1 Apr. 25, 2019

(51) Int. Cl.
| | |
|---|---|
| *G01R 33/561* | (2006.01) |
| *G01R 33/483* | (2006.01) |
| *G01R 33/48* | (2006.01) |
| *G01R 33/56* | (2006.01) |

(52) U.S. Cl.
CPC ..... *G01R 33/5617* (2013.01); *G01R 33/4818* (2013.01); *G01R 33/4835* (2013.01); *G01R 33/5611* (2013.01); *G01R 33/5615* (2013.01); *G01R 33/56* (2013.01)

(58) Field of Classification Search
CPC ........ G01R 33/00; G01R 33/20; G01R 33/44; G01R 33/48; G01R 33/4818; G01R 33/483; G01R 33/4833; G01R 33/4835; G01R 33/54; G01R 33/56; G01R 33/561; G01R 33/5611; G01R 33/5615; G01R 33/5617

USPC ............... 324/300, 307, 312, 313, 315, 309
See application file for complete search history.

(56) References Cited

U.S. PATENT DOCUMENTS

| | | | |
|---|---|---|---|
| 10,261,156 B2* | 4/2019 | de Oliveira | G01R 33/4818 |
| 2011/0241672 A1 | 10/2011 | King et al. | |
| 2012/0025824 A1* | 2/2012 | Harder | G01R 33/543 324/309 |
| 2012/0068704 A1* | 3/2012 | Popescu | G01R 33/4835 324/309 |
| 2013/0249548 A1* | 9/2013 | Stemmer | G01R 33/4835 324/309 |
| 2014/0253120 A1 | 9/2014 | Ugurbil et al. | |

OTHER PUBLICATIONS

Hahn, E.L., "Spin Echoes", Physical Review, vol. 80, No. 4, 6 Pages total, (Nov. 15, 1950).

* cited by examiner

*Primary Examiner* — Hoai-An D. Nguyen
(74) *Attorney, Agent, or Firm* — Oblon, McClelland, Maier & Neustadt, L.L.P.

(57) ABSTRACT

An MRI system includes processing circuitry configured to generate two or more RF pulses to form a spin echo, wherein each RF pulse corresponds to selecting at least two slice locations. Additionally, the MRI system encodes magnetic resonance (MR) magnetization to form echo signal data for each RF pulse, applies a set of time-shifts to a slice-selection gradient for each selected slice location, generates a pattern of slice-position-dependent moments on the echo signal data based on the set of time-shifts to the slice-selection gradient, receives image data corresponding to the echo signal data, and reconstructs the image data to form a plurality of images, wherein each of the plurality of images corresponds to one of the selected slice locations.

20 Claims, 3 Drawing Sheets

SYSTEMS, METHODS, AND COMPUTER-READABLE STORAGE MEDIUM FOR MAGNETIC RESONANCE IMAGING

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Magnetic resonance imaging (MRI) is an imaging scan method that magnetically excites nuclear spins of a subject placed in a magnetostatic field by a radio frequency (RF) pulse having a Larmor frequency thereof, to generate an image from magnetic resonance signal data generated with the excitation.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
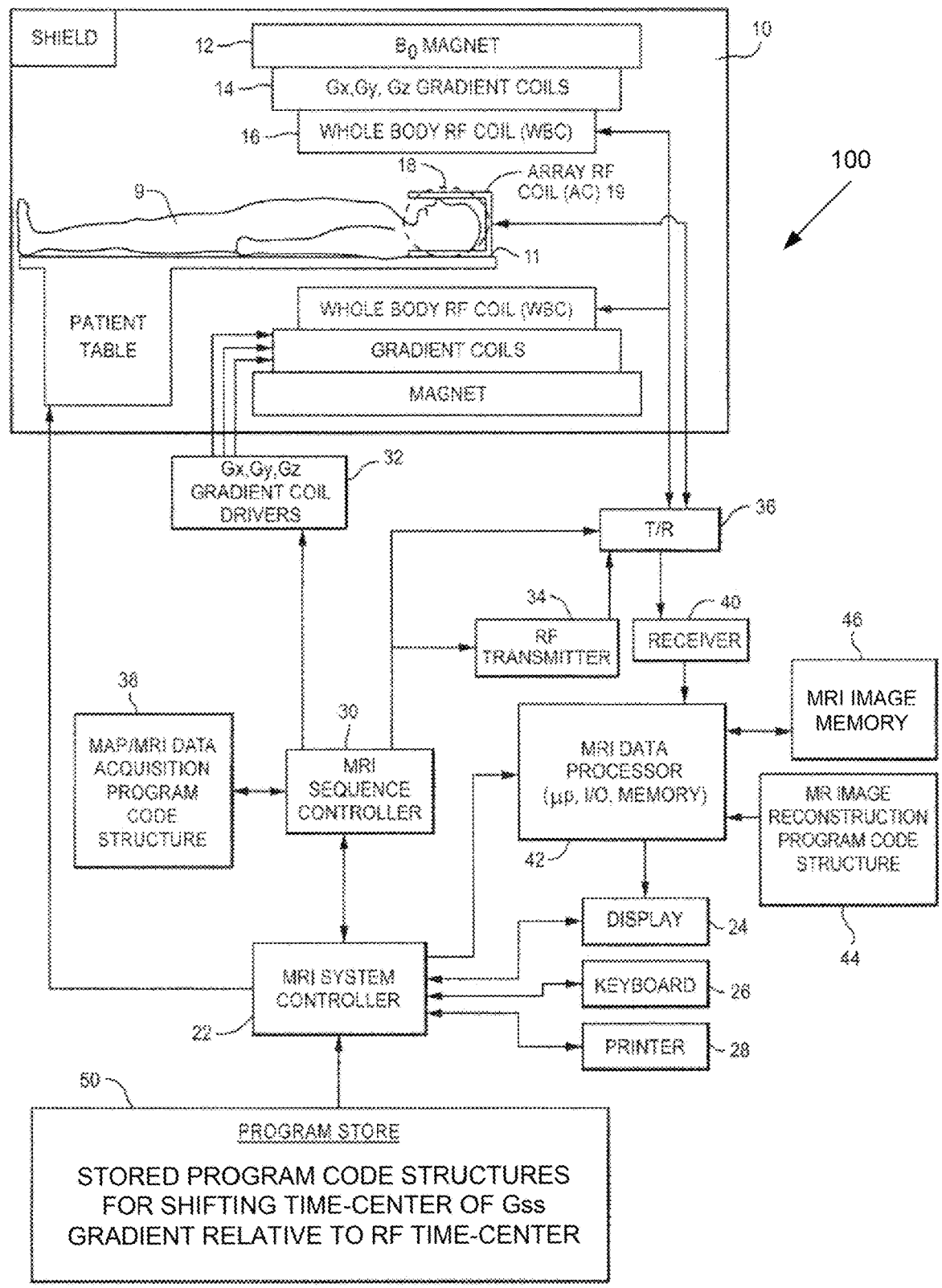
FIG. 1 depicts an exemplary overview of an MRI system according to one or more aspects of the disclosed subject matter.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Referring now to the drawings, wherein like reference numerals designate identical or corresponding parts throughout the several views.

According to embodiments of the disclosed subject matter, an MRI system includes processing circuitry configured to generate two or more RF pulses to form a spin echo, wherein each RF pulse corresponds to selecting at least two slice locations. Additionally, the MRI system encodes magnetic resonance (MR) magnetization to form echo signal data for each RF pulse, applies a set of time-shifts to a slice-selection gradient for each selected slice location, generates a pattern of slice-position-dependent moments on the echo signal data based on the set of time-shifts to the slice-selection gradient, receives image data corresponding to the echo signal data, and reconstructs the image data to form a plurality of images, wherein each of the plurality of images corresponds to one of the selected slice locations.

Simultaneous multislice (SMS) imaging techniques can simultaneously excite a plurality of slice positions with one RF pulse, and each slice excited can be reconstructed as a separate image (e.g., one image for each slice position). Although SMS imaging techniques can reduce scan times and increase the number of slices, current approaches to SMS imaging techniques include various drawbacks and limitations.

The Controlled Aliasing in Parallel Imaging Results in Higher Acceleration (CAIPIRINHA) method includes a controlled aliasing of multiple slice images. More specifically, slices can be shifted in a controlled manner in a phase encoding (PE) direction. This shift can be achieved by applying a different phase to spins from each slice (e.g., using an RF pulse simultaneously selecting multiple slice locations with a different $T_x$ phase for each slice location) and reconstructing separate slices using existing parallel imaging methods (e.g., SENSE, GRAPPA, etc.). The primary advantage of CAIPIRANHA is to achieve SMS with an improved signal-to-noise ratio (SNR). By shifting the slice images, the slice images occupy more of the field of view (FOV) and can be less overlapped as a result. These shifted images can be reconstructed while maintaining an acceptable SNR. However, CAIPIRINHA can be limited to simple magnetic resonance pulse sequences without an echo train (e.g., field echo (FE), spin echo (SE)) because they only acquire one phase encode line of data per RF excitation pulse. The sequence can be repeated with different RF pulses for each phase encode to cause the image to shift.

The conventional CAIPIRINHA method cannot be applied to pulse sequences containing an echo train (e.g., fast spin echo (FSE) or echo planar imaging (EPI)) because there only exists one RF excitation pulse for multiple phase encode lines. Therefore, the ability to apply a slice-positiondependent phase for each phase encode line individually is lost. Blipped CAIPIRINHA includes the concept of CAIPIRINHA, but applies a slice-dependent phase using $G_{SS}$ (gradient on slice-selection (SS) axis) "blips" throughout the echo train. More specifically, the blipped CAIPIRINHA technique uses $G_{SS}$ blips to cause slices to accrue a slice-position-dependent phase and the blips can be rewound to prevent slice dephasing from accruing during the echo train. As a result, $G_{SS}$ blips are easy to add in echo planar imaging (EPI) as there are no $G_{SS}$ gradients during an EPI echo train. However, $G_{SS}$ blips are not easy to add in fast spin echo (FSE) as a result of existing $G_{SS}$ gradients (e.g., slice crushers and rewinders). For example, in FSE, $G_{SS}$ gradients are often large amplitude (near maximum), and in order to reduce interecho spacing, crusher duration is minimized and amplitude is increased. Additionally, adding $G_{SS}$ blips after slice crushers would extend interecho spacing, which is a critical parameter in FSE.

As further described herein, FSE with time-shifted $G_{SS}$ gradient does not require adding an extra gradient blip. By shifting a time-center of the $G_{SS}$ gradient relative to the RF time-center, the gradient keeps the same amplitude and waveshape as the gradient is only shifted in time. Further, the RF pulses can remain at the same time positions to maintain echo timing.

FIG. 1 depicts an exemplary overview of a magnetic resonance imaging (MRI) system 100 according to one or more aspects of the disclosed subject matter. The MRI system 100 includes a gantry 10 (shown in schematic cross section) and various related system components interfaced therewith. At least the gantry 10 is typically located in a shielded room. One MRI system geometry depicted in FIG. 1 includes a substantially coaxial cylindrical arrangement of the static field $B_0$ magnet 12, a Gx, Gy, and Gz gradient coil set 14 and a large whole body RF coil (WBC) assembly 16. The physical Gx, Gy, and Gz gradient axes can be controlled in such a way to create $G_{RO}$, $G_{PE}$, and $G_{SS}$ (readout, phase encode, slice-selection) functional axes. Along the horizontal axis of the cylindrical array of elements is an imaging volume 18 shown as substantially encompassing the chest of a patient 9 supported by a patient table 11. A smaller RF coil 19 is shown as more closely coupled to the head of the patient 9 in image volume 18. RF coil 19 can be a surface coil or array or the like, and can be customized or shaped for particular body parts, such as skulls, arms, shoulders, elbows, wrists, knees, legs, chests, spines, etc. An MRI system controller 22 interfaces with MRI sequence controller 30, which, in turn controls the Gx, Gy, and Gz gradient coil drivers 32, as well as the RF transmitter 34 and the transmit/receive switch 36 (if the same RF coil is used for both transmission and reception). The MRI sequence controller 30 includes suitable program code structure 38 for implementing data acquisition sequences including a fast spin echo (FSE) pulse sequence with a time-shifted $G_{SS}$ gradient, for example. The MRI system controller 22 also can optionally interface with a printer 28, a keyboard 26, and a display 24.

The various related system components include an RF receiver 40 providing input to data processor 42, which is configured to create processed image data, which is then sent to display 24. The MRI data processor 42 is also configured for access to previously acquired data acquisitions of pulse sequences with a time-shifted $G_{SS}$ gradient stored in MRI image memory 46, and to correct/compensate MR image data such as program code structure 50, as well as MRI image reconstruction program code structure 44.

Also illustrated in FIG. 1 is a generalized depiction of an MRI system program store 50 where stored program code structures (e.g., for defining graphical user interfaces and accepting operator inputs to the graphical user interface, etc.) are stored in non-transitory computer-readable storage media accessible to the various data processing components of the MRI system. The program store 50 may be segmented and directly connected, at least in part, to different elements of the various related system components as needed.

FIG. 1 depicts a simplified diagram of an MRI system with some modifications so as to practice exemplary embodiments described herein. The system components can be divided into different collections of "boxes" and can include numerous digital signal processors, microprocessors, and special-purpose processing circuits that are configured to perform, for example, fast analog/digital conversions, Fourier transforms, and array processing. Each of these processing circuits can be a clocked "state machine" wherein the physical data processing circuits progress from one physical state to another upon the occurrence of each clock cycle (or predetermined number of clock cycles.)

Not only can the physical state of the processing circuits (e.g., CPU's, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of a time-shifted $G_{SS}$ gradient imaging reconstruction process, an array of computer-readable accessible data value storage sites in physical storage media will be transformed from some prior state (e.g., all uniform "zero values of all "one" values) to a new state, wherein the physical states at the physical sites of such an array vary between minimum and maximum values to represent real world physical events and conditions (e.g., the internal physical structures of a patient over an imaged volume space). Such arrays of stored data values represent and also constitute a physical structure—as does a particular structure of computer control program codes that, when sequentially loaded into instruction registers and executed by one or more CPUs of the various related system components, causes a particular sequence of operational states to occur and be transitioned through within the MRI system.

Figure 2:
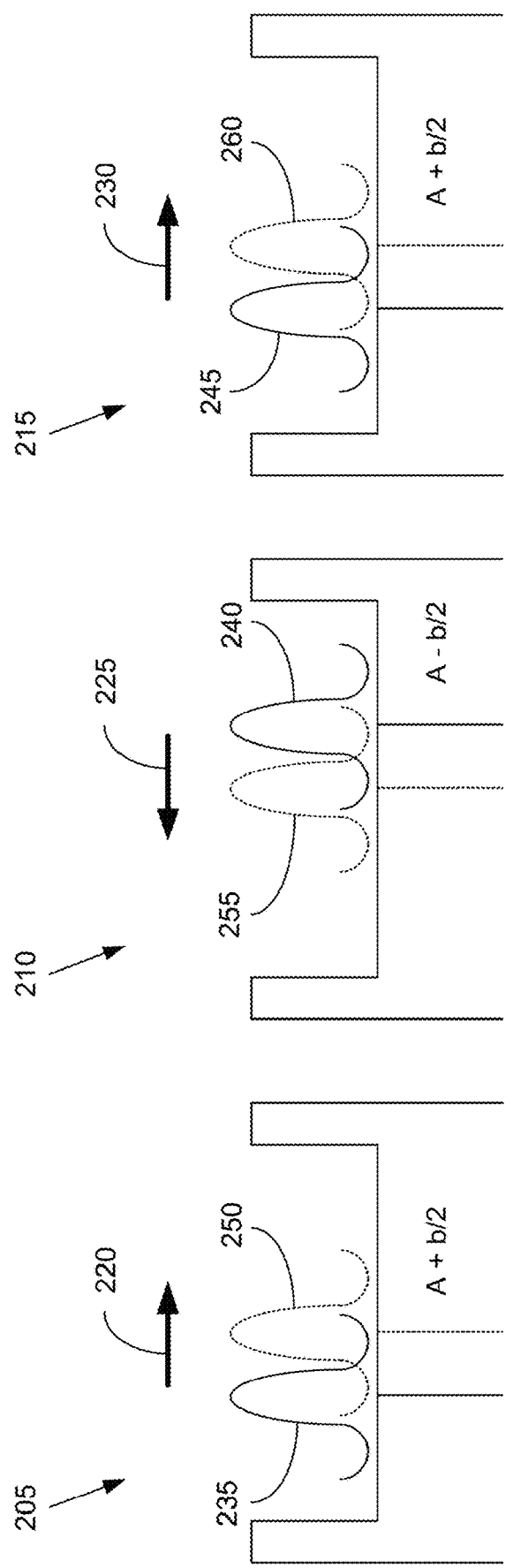
FIG. 2 depicts a fast spin echo (FSE) pulse sequence with a time-shifted $G_{SS}$ gradient according to one or more aspects of the disclosed subject matter.

FIG. 2 depicts a fast spin echo (FSE) pulse sequence with a time-shifted $G_{SS}$ gradient according to one or more aspects of the disclosed subject matter. An FSE pulse sequence uses a series of 180°-refocusing pulses after a single 90°-pulse to generate a train of echoes. The FSE technique changes the phase-encoding gradient for each of these echoes (a conventional multi-echo sequence collects all echoes in a train with the same phase encoding). As a result of changing the phase-encoding gradient between echoes, multiple lines of k-space (i.e., phase-encoding steps) can be acquired within a given repetition time (TR). Because multiple phase-encoding lines are acquired during each TR interval, FSE techniques can significantly reduce imaging time.

In a typical pulse sequence, each RF pulse includes an equal integral of gradients (e.g., time integral of the gradient) on a left side of the RF pulse and a right side of the RF pulse. The balance or symmetry of the RF pulse can be based on a magnetic center of the RF pulse.

The FSE pulse sequence in FIG. 2 includes a first pulse 205, a second pulse 210, and a third pulse 215, wherein each pulse can be an RF pulse. Each RF pulse (e.g., the first pulse 205, the second pulse 210, and the third pulse 215) can include an arrow indicating a direction in which the $G_{SS}$ gradient is shifted relative to the RF pulse. In other words, an arrow pointing from left to right (e.g., arrow 220) can correspond to having shifted the gradient waveform from left to right such that there is less integral (i.e., moment) on the left side of the RF pulse than the right side of the RF pulse (e.g., first pulse 205). As a result, the right side of the RF pulse can have an area that includes more integral (i.e., moment). Similarly, shifting the RF pulse from right to left corresponds to the left side of the RF pulse having more integral (i.e., moment) and the right side of the RF pulse having less integral (i.e., moment). Each pulse 205, 210, and 215 includes a time-shifted Gss waveform 235, 240, and 245, respectively. Additionally, FIG. 2 depicts that the Gss waveform 235 is shifted relative to RF pulse 250, Gss waveform 240 is shifted relative to RF pulse 255, and Gss waveform 245 is shifted relative to RF pulse 260.

The depiction of the first pulse 205 includes an arrow 220 indicating a direction in which the $G_{SS}$ gradient of the first pulse 205 is time-shifted relative to the first pulse 205. The first pulse 205 includes a time-shifted $G_{SS}$ gradient 235 of A+b/2 where "A" is the area under the curve before the shift and "b" is the extra moment that can be added/subtracted from each echo. The arrow 220 corresponding to the first pulse 205 indicates that the shift is to the right relative to the first pulse (i.e., the RF pulse 250), which can correspond to the extra moment being added to the echo. The second pulse 210 includes a time-shifted $G_{SS}$ gradient 240 of A−b/2, and the arrow 225 corresponding to the second pulse 210 indicates that the shift is to the left relative to the second pulse (i.e., the RF pulse 255), which can correspond to the extra moment being subtracted from the echo. The third pulse 215 includes a time-shifted $G_{SS}$ gradient 245 of A+b/2, and the arrow 230 corresponding to the third pulse 215 indicates that the shift is to the right relative to the third pulse (i.e., the RF pulse 260), which can correspond to the extra moment being added to the echo. The pulse sequence depicted in FIG. 2 of right, left, right (i.e., add, subtract, add) is simply exemplary, and it should be appreciated that various pulse sequences can be used accordingly.

The pulse sequence depicted in FIG. 2 can include a readout displayed (e.g., on the display 24 in FIG. 1) between each RF pulse. At the readout echo, the echo will have a nonzero slice-selection (SS) moment caused by a difference of balance of the integral of the slice-selection gradient ($G_{SS}$) relative to RF magnetic center. Thus, each readout can have an SS moment (e.g., wherein SS moment implies slice-position-dependent phase). When each readout has a different slice-position-dependent phase, the image of each slice is shifted relative to one another accordingly in the intermediate overlapped image, which is to be reconstructed into separate images, as described below. Additionally, the time-shift of the $G_{SS}$ waveform is proportional to the SS moment at the echo. More specifically, the extra moment (i.e., "b") is equal to the time-shift multiplied by the $G_{SS}$ amplitude. A timing pattern can be built where positive (e.g., to the right in FIG. 2) and negative (i.e., to the left in FIG. 2) time-shifts can be applied that can cause positive and negative SS moment accumulation, respectively. Further, the moment can be added or rewound based on the positive/negative shift pattern. The pattern can consist of a series of positive and negative steps. Typically, the number of elements in a pattern is matched to the number of slices simultaneously selected. For instance, a [+1,−1] pattern can be repeated to shift two slices relative to each other. Other patterns can include [+2, −1] to shift three slices relative to each other or [+3, −1, −1, −1] to shift four slices.

In one embodiment, the RF pulses can be multi-band (MB) RF pulses.

In one embodiment, the RF pulses can be SAR-reduced MB pulses (e.g., PINS, phase-optimized MB RF pulses, etc.), where SAR corresponds to specific absorption rate.

Regarding the timing of the $G_{SS}$ gradient time-shift, the RF timing can remain fixed, thereby maintaining the CPMG (Can Purcell Meiboom Gill) sequence. Additionally, the readout and phase encode gradients can remain fixed, the $G_{SS}$ waveform can retain the same amplitude and wave shape, the $G_{SS}$ waveform can be time-shifted, and the extra $G_{SS}$ moment (e.g., "b" in FIG. 2) at each echo can cause a slice-position-dependent shift in the phase encode (PE) direction.

In one embodiment, a "flat top" duration on the $G_{SS}$ waveform can be extended beyond the minimum duration allowable, thereby allowing $G_{SS}$ to shift without affecting RF selection. The flat top is the region of uniform amplitude in the middle of the slice-selection gradient waveform where RF pulse is typically executed.

In an embodiment, the image can be reconstructed using parallel imaging techniques (e.g., SENSE, GRAPPA, etc.) as would be known by a person of ordinary skill in the art.

Figure 3:
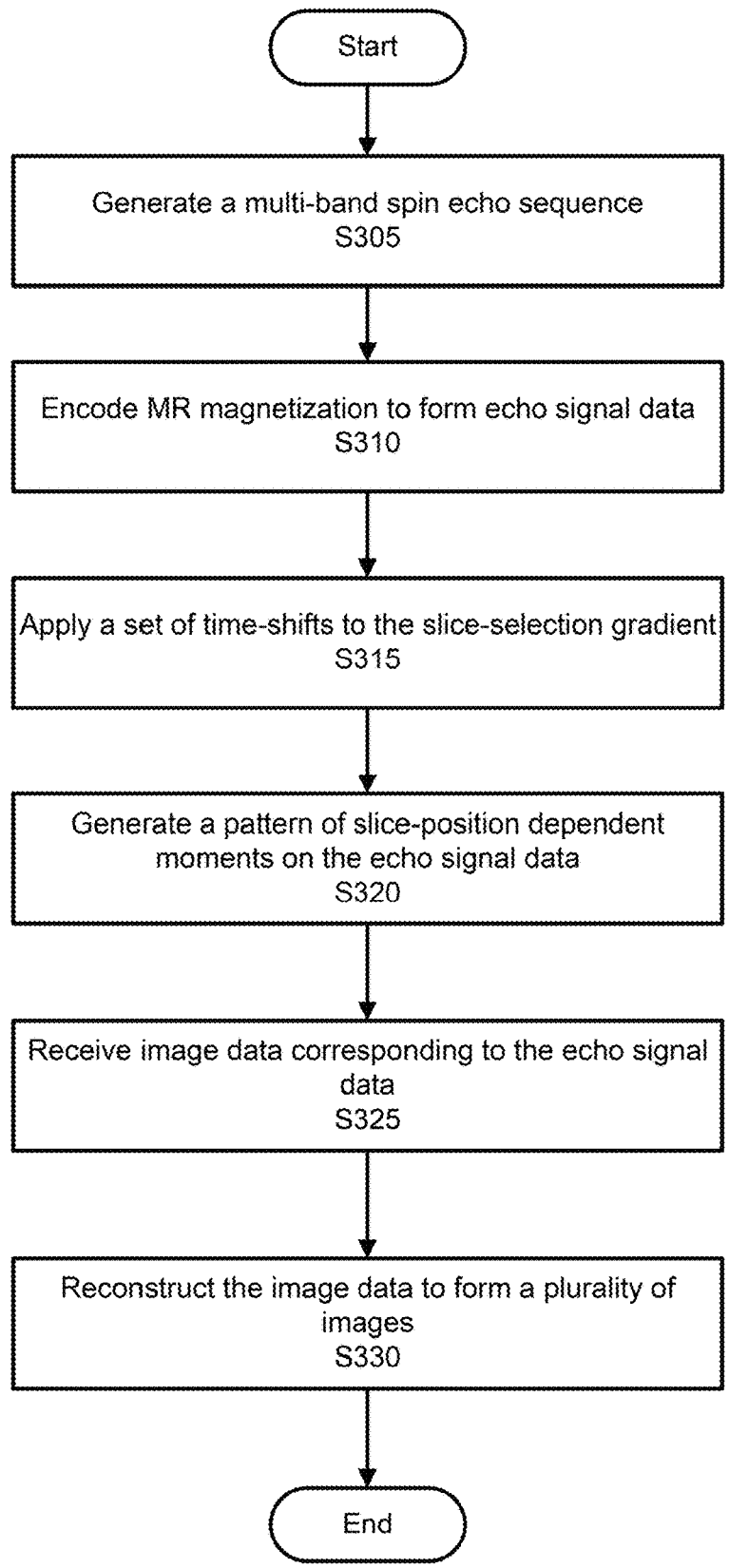
FIG. 3 is an algorithmic flow chart for producing a plurality of images from an MRI system according to one or more aspects of the disclosed subject matter.

FIG. 3 is an algorithmic flow chart for producing a plurality of images from the MRI system 100 according to one or more aspects of the disclosed subject matter.

In step S305, a multi-band spin echo sequence can be generated. For example, a plurality of RF pulses (e.g., two or more RF pulses) can form a spin echo (or a series of spin echoes), wherein each RF pulse can be configured to select at least two slice locations.

In step S310, MR magnetization can be encoded to form echo signal data. For example, a predetermined set of readout, phase encode, and slice-selection gradients can be configured to encode MR magnetization to form echo signal data.

In step S315, a set of time-shifts can be applied to the slice-selection gradient. In other words, the time position of the slice-selection gradient relative to the RF pulse is being shifted. Additionally, this shift can be applied to the slice-selection of the RF pulse that occurs before each readout.

In step S320, a pattern of time-shifts can be generated on the echo signal data. For example, a pattern of time-shifts of the slice-selection gradient can be generated. As a result, even though time position changes within the sequence, all gradient waveforms and amplitudes can remain the same throughout the imaging process.

Each time-shift can apply a slice-position-dependent phase onto each readout echo of the echo train. The slice-dependent phase can be applied in a predetermined pattern so as to result in a linear phase increase in the phase-encode direction. By the property of the Fourier transform, wherein a linear phase increase in frequency space results in a linear shift in image space, the simultaneously selected slices can be shifted relative to one another.

In step S325, image data corresponding to the echo signal data can be received. For example, the echo signal data can be acquired as k-space data.

In step S330, the image data can be reconstructed to form an intermediate image with signals from all simultaneously selected slices overlapping one another.

This intermediate image can be further reconstructed to generate a plurality of images, wherein each image depicts the data from one of the plurality of selected slice locations. Such a reconstruction can involve parallel reconstruction methods, including SENSE or GRAPPA, as known by one of ordinary skill in the art.

The MRI system 100 includes various advantages. For example, the MRI system 100, and more specifically the process described in FIG. 3, can increase a number of slices selected within a fixed scan time or acquire a fixed number of slices while decreasing scan time. Additionally, using a pulse sequence with a time-shifted $G_{SS}$ gradient can remove the need to add additional gradient waveforms, such as the "blips" used in blipped CAIPIRINHA. Further, using a pulse sequence with a time-shifted $G_{SS}$ gradient assists in maintaining gradient amplitude, gradient power, duty cycle, and acoustic noise over time. In other words, by shifting a time-center of the $G_{SS}$ gradient relative to the RF magnetic center rather than adding anything extra to the gradient, the MRI system 100 can be more efficient and prevent running into practical hardware limitations (e.g., don't have infinite power, don't have infinite duty cycle, etc.).

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. An MRI system, comprising:
   processing circuitry configured to
      generate two or more RF pulses to form a spin echo, wherein each RF pulse corresponds to selecting at least two slice locations,
      encode magnetic resonance (MR) magnetization to form echo signal data,
      apply a set of time-shifts to a slice-selection gradient,
      generate a pattern of slice-position-dependent moments on the echo signal data based on the set of time-shifts to the slice-selection gradient,
      receive image data corresponding to the echo signal data, and
      reconstruct the image data to for in a plurality of images, wherein each of the plurality of images corresponds to one of the selected slice locations.

2. The MRI system of claim 1, wherein at least one of the two or more RF pulses generated by the processing circuitry is an excitation pulse.

3. The MRI system of claim 1, wherein at least one of the two or more RF pulses generated by the processing circuitry is a refocus pulse.

4. The MRI system of claim 1, wherein the two or more RF pulses generated by the processing circuitry form a series of spin echoes.

5. The MRI system of claim 1, wherein the image data received by the processing circuitry is in k-space.

6. The MRI system of claim 1, wherein a waveform of the slice-selection gradient generated by the processing circuitry remains unchanged.

7. The MRI system of claim 1, wherein an amplitude of the slice-selection gradient generated by the processing circuitry remains unchanged.

8. A method for magnetic resonance (MR) imaging, comprising:
   generating two or more RF pulses to form a spin echo, wherein each RF pulse corresponds to selecting at least two slice locations;
   encoding magnetic resonance (MR) magnetization to form echo signal data;
   applying a set of time-shifts to a slice-selection gradient;
   generating a pattern of slice-position-dependent moments on the echo signal data based on the set of time-shifts to the slice-selection gradient;
   receiving image data corresponding to the echo signal data; and
   reconstructing the image data to form a plurality of images, wherein each of the plurality of images corresponds to one of the selected slice locations.

9. The method of claim 8, wherein at least one of the two or more RF pulses generated to form a spin echo is an excitation pulse.

10. The method of claim 8, wherein at least one of the two or more RF pulses generated to form a spin echo is a refocus pulse.

11. The method of claim 8, wherein the two or more RF pulses form a series of spin echoes.

12. The method of claim 8, wherein receiving the image data corresponding to the echo signal data further comprises:
   receiving the image data in k-space.

13. The method of claim 8, wherein a waveform of the slice-selection gradient remains unchanged.

14. The method of claim 8, wherein an amplitude of the slice-selection gradient remains unchanged.

15. A non-transitory computer-readable storage medium storing computer-readable instructions thereon which, when executed by a computer, cause the computer to perform a method, the method comprising:
   generating two or more RF pulses to form a spin echo, wherein each RF pulse corresponds to selecting at least two slice locations;
   encoding magnetic resonance (MR) magnetization to form echo signal data;
   applying a set of time-shifts to a slice-selection gradient;
   generating a pattern of slice-position-dependent moments on the echo signal data based on the set of time-shifts to the slice-selection gradient;
   receiving image data corresponding to the echo signal data; and
   reconstructing the image data to form a plurality of images, wherein each of the plurality of images corresponds to one of the selected slice locations.

16. The non-transitory computer-readable storage medium of claim 15, wherein at least one of the two or more RF pulses is an excitation pulse.

17. The non-transitory computer-readable storage medium of claim 15, wherein at least one of the two or more RF pulses is a refocus pulse.

18. The non-transitory computer-readable storage medium of claim 15, wherein the two or more RF pulses farm a series of spin echoes.

19. The non-transitory computer-readable storage medium of claim 15, wherein a waveform of the slice-selection gradient remains unchanged.

20. The non-transitory computer-readable storage medium of claim 15, wherein an amplitude of the slice-selection gradient remains unchanged.

* * * * *